(12) United States Patent
Lee et al.

(10) Patent No.: US 11,935,970 B2
(45) Date of Patent: Mar. 19, 2024

(54) METHOD FOR COATING PHOTOVOLTAIC PANEL, AND PHOTOVOLTAIC POWER GENERATING DEVICE USING SAME

(71) Applicant: BK ENERGY CO., LTD., Yeousu-si (KR)

(72) Inventors: Haeng Woo Lee, Yeosu-si (KR); Hyo Sook Song, Yeosu-si (KR); Do Hyeon Lee, Yeosu-si (KR)

(73) Assignee: BK ENERGY CO., LTD., Yeosu-si (KR)

( * ) Notice: Subject to any disclaimer, the term of this patent is extended or adjusted under 35 U.S.C. 154(b) by 399 days.

(21) Appl. No.: 17/418,356

(22) PCT Filed: Dec. 4, 2019

(86) PCT No.: PCT/KR2019/017043
§ 371 (c)(1),
(2) Date: Jun. 25, 2021

(87) PCT Pub. No.: WO2020/138752
PCT Pub. Date: Jul. 2, 2020

(65) Prior Publication Data
US 2022/0077325 A1    Mar. 10, 2022

(30) Foreign Application Priority Data

Dec. 28, 2018   (KR) ........................ 10-2018-0172748

(51) Int. Cl.
*H01L 31/0216*   (2014.01)
*H01L 21/02*     (2006.01)
(Continued)

(52) U.S. Cl.
CPC .. *H01L 31/02167* (2013.01); *H01L 21/02052* (2013.01); *H01L 31/18* (2013.01); *H02S 40/10* (2014.12)

(58) Field of Classification Search
CPC .......... B08B 2209/005; B08B 2203/02; B08B 2203/0217; H02S 40/10; H02S 30/10;
(Continued)

(56) References Cited

FOREIGN PATENT DOCUMENTS

EP           1059676 A2 * 12/2000  ............... F24J 2/461
KR    10-2012-0009865 A    2/2012
(Continued)

OTHER PUBLICATIONS

EP-1059676-A2—English Machine Translation (Year: 2023).*
(Continued)

*Primary Examiner* — Jose R Diaz
(74) *Attorney, Agent, or Firm* — Eric L. Lane; Green Patent Law

(57) ABSTRACT

The present invention relates to a method for coating a photovoltaic panel, and a photovoltaic power generating device using same and, more specifically, to a method for coating a photovoltaic panel, and a photovoltaic power generating device using same, wherein the method inhibits various pollutants such as dust and salt from attaching to the surface of a photovoltaic panel so as to increase power generation efficiency. The method for coating a photovoltaic panel, of the present invention, comprises: a water washing step of washing the surface of the photovoltaic panel by, spraying water thereonto; a cleaning liquid applying step of applying a cleaning liquid to the surface of the photovoltaic panel after the water washing step; a rinsing step of spraying washing water after the cleaning liquid applying step so as to remove pollutants and the cleaning liquid on the surface of the photovoltaic panel; and a coating liquid applying step of applying a coating liquid to the surface of the photovoltaic panel after the rinsing step so as to form an anti-stain coating film.

3 Claims, 3 Drawing Sheets

(51) Int. Cl.
*H01L 31/18* (2006.01)
*H02S 40/10* (2014.01)

(58) Field of Classification Search
CPC ............ C11D 11/0064; C11D 11/0047; C11D 11/0035; H01L 31/02167; H01L 31/18; H01L 21/02052; Y02E 10/50
See application file for complete search history.

(56) References Cited

FOREIGN PATENT DOCUMENTS

| KR | 10-1111492 B1 | 2/2012 | | |
|---|---|---|---|---|
| KR | 10-2012-0129611 A | 11/2012 | | |
| KR | 10-2014-0090771 A | 7/2014 | | |
| KR | 10-2018-0034754 A | 4/2018 | | |
| KR | 2018034754 A | * | 4/2018 | ............. B08B 1/002 |

OTHER PUBLICATIONS

KR-2018034754-A—English Machine Translation (Year: 2023).*
International Search Report and Written Opinion in related International Patent Application No. PCT/KR2019/017043.

* cited by examiner

METHOD FOR COATING PHOTOVOLTAIC PANEL, AND PHOTOVOLTAIC POWER GENERATING DEVICE USING SAME

TECHNICAL FIELD

The present invention relates to a method of coating a photovoltaic panel and a photovoltaic device using the same, and more particularly, to a method of coating a photovoltaic panel capable of increasing power generation efficiency by inhibiting the adhesion of various contaminants such as dust and salt to a surface of the photovoltaic panel, and a photovoltaic device using the same.

BACKGROUND ART

Photovoltaic power generation is a power generation method that uses solar cells capable of generating photovoltaic power through the photovoltaic effect upon exposure to sunlight, and a photovoltaic device generally includes a photovoltaic panel manufactured by modularizing solar cells, and a storage battery, and a power conversion device.

Photovoltaic power generation is classified into a fixed type, a fixed variable type, a single-axis tracking type, and a double-axis tracking type according to the orientation and angle of a photovoltaic panel, which are changed depending on whether the photovoltaic panel is fixedly installed or the movement path of the sunlight.

In the field of photovoltaic power generation, various technological developments have been made in order to achieve higher efficiency at lower installation costs.

Since photovoltaic panels should be installed outdoors where they can effectively absorb sunlight, the photovoltaic panels are inevitably exposed to all kinds of external contaminants. These contaminants contaminate the surface of glass installed on the top surface of the photovoltaic panels, greatly reducing photovoltaic power generation efficiency.

It is known that even when the amount of light transmission is reduced by only 3%, the amount of power generation will be reduced by an average of 10% or more. Therefore, the contamination of the glass surface of a photovoltaic panel is the main cause that greatly reduces the economic viability of photovoltaic power generation.

In particular, scattering dust, which is micrometer-sized fine dust that usually accumulates on a glass surface, spreads on the glass surface of a photovoltaic panel by the surface tension of water when in contact with rain, and aggregates when dried. Therefore, it is essential to clean the glass surface of a photovoltaic panel with a cleaning liquid in a timely manner, and companies operating photovoltaic power generation plants hire cleaning services to periodically clean the glass surface of a photovoltaic panel with a detergent.

Korean Laid-Open Patent Application No. 10-2018-0034754 discloses a method of cleaning a photovoltaic panel.

However, there is a problem in that in the process of wiping with a cloth or brush, the surface of a photovoltaic panel is scratched.

DISCLOSURE

Technical Problem

The present invention is directed to providing a method of coating a photovoltaic panel, which is capable of preventing various contaminants such as dust and salt from attaching to a surface of a photovoltaic panel by forming an anti-stain coating film on the surface of the photovoltaic panel and thus is capable of increasing power generation efficiency, and a photovoltaic device using the same.

Technical Solution

One aspect of the present invention provides a method of coating a photovoltaic panel, which includes: a water-washing step of washing a surface of a photovoltaic panel by spraying water thereon; a cleaning liquid application step of applying a cleaning liquid on the surface of the photovoltaic panel after the water-washing step; a rinsing step of removing contaminants and the cleaning liquid on the surface of the photovoltaic panel by spraying washing water after the cleaning liquid application step; and a coating liquid application step of applying a coating liquid on the surface of the photovoltaic panel after the rinsing step and thus forming an anti-stain coating film.

The rinsing step includes a) a first spraying step of spraying any one type of washing water selected from among alkaline water, neutral water, and acidic water on the surface of the photovoltaic panel, and h) a second spraying step of spraying purified water on the surface of the photovoltaic panel after the first spraying step.

In the rinsing step, the washing water is sprayed while ultrasonic vibrations are applied to the surface of the photovoltaic panel.

The coating liquid is formed by mixing 20 to 60 parts by weight of an acrylic solution, 5 to 15 parts by weight of a fluoroalcohol, and 2 to 10 parts by weight of a platinum colloid with respect to 100 parts by weight of an alkoxysilane solution, wherein the alkoxysilane solution is obtained by mixing, with respect to 100 parts by weight of a solvent, 100 to 150 parts by weight of methyltrimethoxysilane, and the acrylic solution is obtained by mixing 20 to 40 parts by weight of an ethyl acrylate monomer and 2 to 8 parts by weight of polyvinylpyrrolidone with respect to 100 parts by weight of methacrylic acid at a temperature of 70 to 90° C. and then adding 1 to 10 parts by weight of a wax and 0.5 to 5 parts by weight of polyoxyethylene stearyl ether.

Another aspect of the present invention provides a photovoltaic device, which includes: a support frame; and a photovoltaic panel supported by the support frame, wherein an anti-stain coating film is formed on the photovoltaic panel, and the anti-stain coating film is formed by applying a coating liquid after removing contaminants on a surface of the photovoltaic panel.

Advantageous Effects

As described above, according to the present invention, since an anti-stain coating film is formed on a surface of a photovoltaic panel to prevent various contaminants such as dust and salt from attaching to the surface of the photovoltaic panel, power generation efficiency can be increased.

In addition, the technique of the present invention can be used for removing contaminants from a previously installed photovoltaic panel having surface contamination, and subsequently forming an anti-stain coating film on the surface of the photovoltaic panel.

MODES OF THE INVENTION

Hereinafter, a method of coating a photovoltaic panel according to one exemplary embodiment of the present invention and a photovoltaic device using the same will be described in detail with reference to the accompanying drawings.

A photovoltaic panel has a form in which a plurality of solar cells are modularized, and a top surface thereof is usually covered with glass. Since various contaminants such as dust are attached to the surface of the photovoltaic panel, the contaminants attached to the surface of the photovoltaic panel should be removed and an anti-stain coating film should be formed before installing the photovoltaic panel so that the surface contamination of the photovoltaic panel after installation can be prevented. In particular, in the case of a photovoltaic device installed on water such as the sea, salt is attached to a photovoltaic panel, contaminating the photovoltaic panel.

Figure 1:
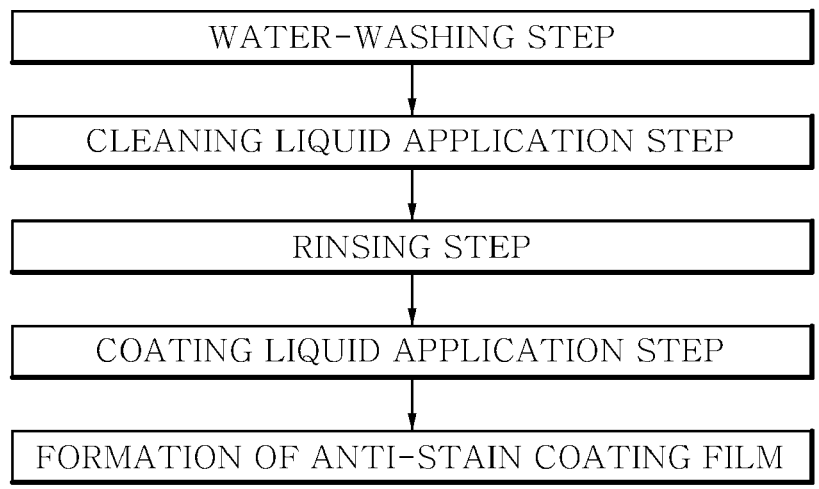
FIG. 1 is a block diagram schematically illustrating a method of coating a photovoltaic panel according to one exemplary embodiment of the present invention.

Referring to FIG. 1, a method of coating a photovoltaic panel according to one exemplary embodiment of the present invention includes: a water-washing step of washing a surface of a photovoltaic panel by spraying water thereon; a cleaning liquid application step of applying a cleaning liquid on the surface of the photovoltaic panel after the water-washing step; a rinsing step of removing contaminants and the cleaning liquid on the surface of the photovoltaic panel by spraying washing water after the cleaning liquid application step; and a coating liquid application step of applying a coating liquid on the surface of the photovoltaic panel after the rinsing step and thus forming an anti-stain coating film. Each of the steps will be described below.

1. Water-Washing Step

First, a photovoltaic panel to be used in a photovoltaic device is provided.

Washing with water is performed to primarily remove contaminants attached to a surface of the photovoltaic panel. To this end, water is sprayed on the surface of the photovoltaic panel to clean the surface of the photovoltaic panel.

The water used in the water-washing step may be groundwater or tap water.

Contaminants attached to the surface of the photovoltaic panel can be primarily removed by spraying water at a constant pressure on the surface of the photovoltaic panel using a conventional spray nozzle.

2. Cleaning Liquid Application Step

Next, a cleaning liquid for removing the remaining contaminants is applied to the surface of the photovoltaic panel.

The cleaning liquid is atomized and applied in the form of fine water droplets by spraying. For example, the cleaning liquid may be applied using a spray gun. The applied cleaning liquid weakens the adhesion of contaminants remaining on the surface of the photovoltaic panel so that the contaminants can be easily removed.

Various known types of cleaning liquids can be used as the cleaning liquid. As the cleaning liquid, any one selected from among an acidic cleaning liquid, a neutral cleaning liquid, and an alkaline cleaning liquid can be used. Depending on the type of contaminant, any one of an acidic cleaning liquid, a neutral cleaning liquid, and an alkaline cleaning liquid is appropriately selected and used. In the case of severe contamination, an acidic cleaning liquid may be used, and it is preferable to use a weakly acidic cleaning liquid having a pH of 6 to 7.

Any cleaning liquid that may chemically or physically affect the surface of photovoltaic panels should be avoided. For example, strongly acidic cleaning liquids such as ones having a pH of 2 to 4 may corrode the glass of photovoltaic panels, so it is not recommended to use strongly acidic cleaning liquids. In addition, cleaning liquids including solid particles may cause scratches on the glass surface of photovoltaic panels, so it is not recommended to use cleaning liquids including solid particles.

3. Rinsing Step

Next, a rinsing step is carried out to remove contaminants and the cleaning liquid remaining on the surface of the photovoltaic panel.

Conventionally, contaminants were mainly removed by applying a detergent and then wiping or rubbing with a rag or brush. Although this conventional method effectively removes foreign substances, the method has a problem of causing fine scratches on the surface of a photovoltaic panel.

Therefore, the present invention employs a method of spraying washing water rather than using a rag or brush as in the conventional case, and removing the contaminants and the cleaning liquid using the kinetic energy of the washing water.

When the washing water is sprayed at a constant pressure on the surface of the photovoltaic panel to which the cleaning liquid has been applied, the remaining contaminants and cleaning agent are removed at the same time.

The rinsing step may include, for example, a) a first spraying step of spraying any one type of washing water selected from among alkaline water, neutral water, and acidic water on the surface of the photovoltaic panel and b) a second spraying step of spraying purified water on the surface of the photovoltaic panel after the first spraying step.

In the first spraying step, any one type of washing water selected from among alkaline water, neutral water, and acidic water is sprayed on the surface of the photovoltaic panel to which the cleaning liquid has been applied. The pH of the alkaline water is preferably in the range of 7.5 to 9, the pH of the neutral water is preferably in the range of 6.5 to 7.5, and the pH of the acidic water is preferably in the range of 5 to 6.5.

The washing water used in the first spraying step varies depending on the type of cleaning liquid. For example, when an acidic cleaning liquid is used, alkaline water may be used as the washing water, and when an alkaline cleaning liquid is used, acidic water may be used as the washing water. In addition, when a neutral cleaning liquid is used, neutral water may be used as the washing water.

The first spraying may be high-pressure spraying. For example, the washing water may be sprayed at a pressure of 6 to 8 bar. Through the first spraying carried out at high pressure, the contaminants and cleaning liquid can be effectively removed.

After the first spraying is completed, purified water is sprayed on the surface of the photovoltaic panel in the second spraying step. The surface of the photovoltaic panel is rinsed for the last time through the second spraying.

The second spraying may be low-pressure spraying. For example, the purified water may be sprayed at a pressure of 4 to 6 bar. With the second spraying carried out at low pressure, the rinsing effect can be improved.

Meanwhile, in another exemplary embodiment of the present invention, the rinsing step may be carried out while applying ultrasonic vibrations to the surface of the photovoltaic panel.

For example, following the application of the cleaning liquid, washing water may be sprayed after applying ultrasonic vibrations to the surface of the photovoltaic panel to weaken the adhesion of contaminants so that the contaminants and cleaning liquid can be more effectively removed.

In order to apply ultrasonic vibrations to the photovoltaic panel, an ultrasonic generator equipped with an ultrasonic vibrator may be brought into contact with the photovoltaic panel. In addition, the ultrasonic vibrations may be applied by positioning the ultrasonic generator a minute distance from the surface of the photovoltaic panel.

The ultrasonic vibrator converts high-frequency current into mechanical vibrations. The 20 to 60 kHz vibrations generated by the ultrasonic vibrator are transmitted to the surface of the photovoltaic panel and promote the desorption of contaminants.

After applying the ultrasonic vibrations, the above-described first spraying and second spraying are sequentially carried out to remove the contaminants and cleaning liquid.

4. Coating Liquid Application Step

After the rinsing step, a coating liquid is applied to the surface of the photovoltaic panel to form an anti-stain coating film.

Figure 2:
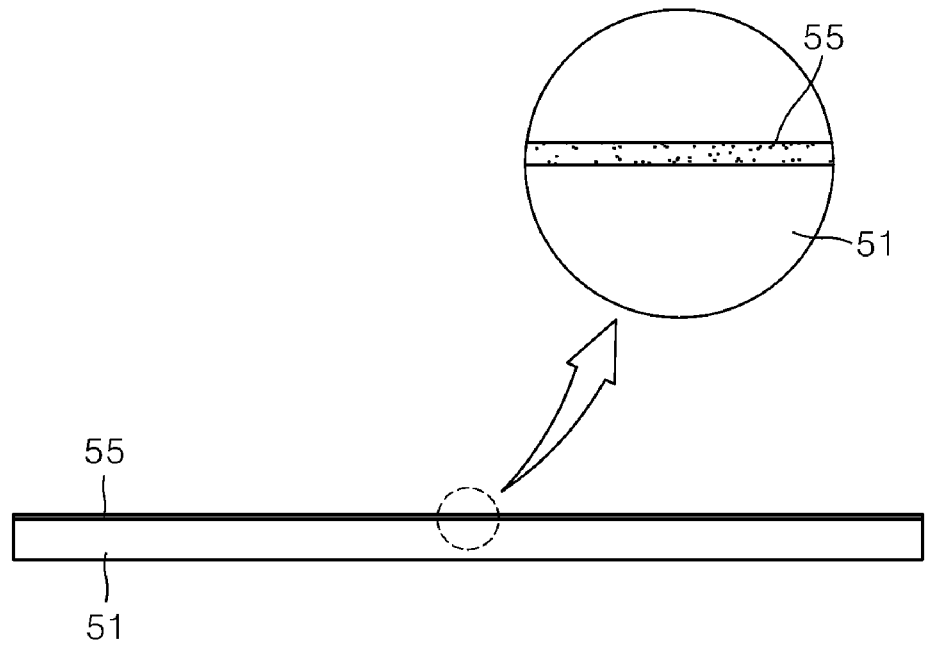
FIG. 2 is a cross-sectional view showing an anti-stain coating film formed on a surface of a photovoltaic panel according to the method of FIG. 1.

As shown in FIG. 2, an anti-stain coating film 55 formed with a small thickness on the surface of the photovoltaic panel 51 inhibits the adhesion of contaminants. The anti-stain coating film may be formed with a thickness of 1 to 100 μm on the surface of the photovoltaic panel.

Although a conventional photovoltaic panel coating agent may be used as the coating agent, it is preferable to use a coating liquid having the following composition so that the effect of preventing the adhesion of contaminants can be enhanced.

For example, the coating liquid may be prepared by mixing 20 to 60 parts by weight of an acrylic solution, 5 to 15 parts by weight of a fluoroalcohol, and 2 to 10 parts by weight of a metal colloid with respect to 100 parts by weight of an alkoxysilane solution.

The alkoxysilane solution is obtained by mixing 100 to 150 parts by weight of an alkoxysilane with respect to 100 parts by weight of an alcohol solvent.

Methyltrimethoxysilane may be used as the alkoxysilane. In addition, methanol, ethanol, isopropanol, or the like may be used as the alcohol solvent.

The acrylic solution improves the adhesion of the coating liquid. The acrylic solution may be obtained by mixing 20 to 40 parts by weight of an ethyl acrylate monomer and 2 to 8 parts by weight of polyvinylpyrrolidone with respect to 100 parts by weight of methacrylic acid at a temperature of 70 to 90° C. and then additionally adding 1 to 10 parts by weight of a wax and 0.5 to 5 parts by weight of polyoxyethylene stearyl ether.

The fluoroalcohol improves anti-stain properties, and any one selected from among trifluoroethanol (TFE), hexafluoroisopropanol (HFIP), and 2,2,3,3-tetrafluoro-1-propanol (TFP) may be used.

A platinum colloid is a solution in which nanometer-sized platinum (Pt) particles are dispersed in a dispersion medium such as distilled water or alcohol. The Pt particles serve to scatter the light incident on a photovoltaic panel, thus increasing the amount of light incident on the photovoltaic panel.

The coating liquid having the above-described composition may be applied to a surface of a photovoltaic panel by a conventional coating method. For example, various methods such as a screen-coating method, a spin-coating method, a spray-coating method, a paint-coating method, and a blade-coating method may be used.

The coating liquid applied to the surface of the photovoltaic panel forms an anti-stain coating film upon curing. This anti-stain coating film has excellent durability and weather resistance, so it is capable of increasing the power generation efficiency of the photovoltaic panel by maximally inhibiting contamination by contaminants such as salt and dust. In particular, the present invention can be particularly usefully applied to a photovoltaic device installed on water such as the sea.

Although the above-described embodiment of the present invention describes a process of washing and coating a photovoltaic panel before installing a photovoltaic device, the technique can also be applied to a photovoltaic device that has already been installed. In this case, the technique of the present invention can be used for removing contaminants from a previously installed photovoltaic panel having surface contamination, and subsequently forming an anti-stain coating film on the surface of the photovoltaic panel.

Meanwhile, as another example of the coating liquid, a composition in which transition metal and metal oxide particles, colloidal silica, and water-soluble silicate are bonded to the surface of titanium dioxide particles may be used. This coating liquid has antistatic and hydrophilic functions and breaks down organic compounds by using OH radicals formed by ultraviolet rays and thus self-cleans the surface of a photovoltaic panel.

Figure 3:
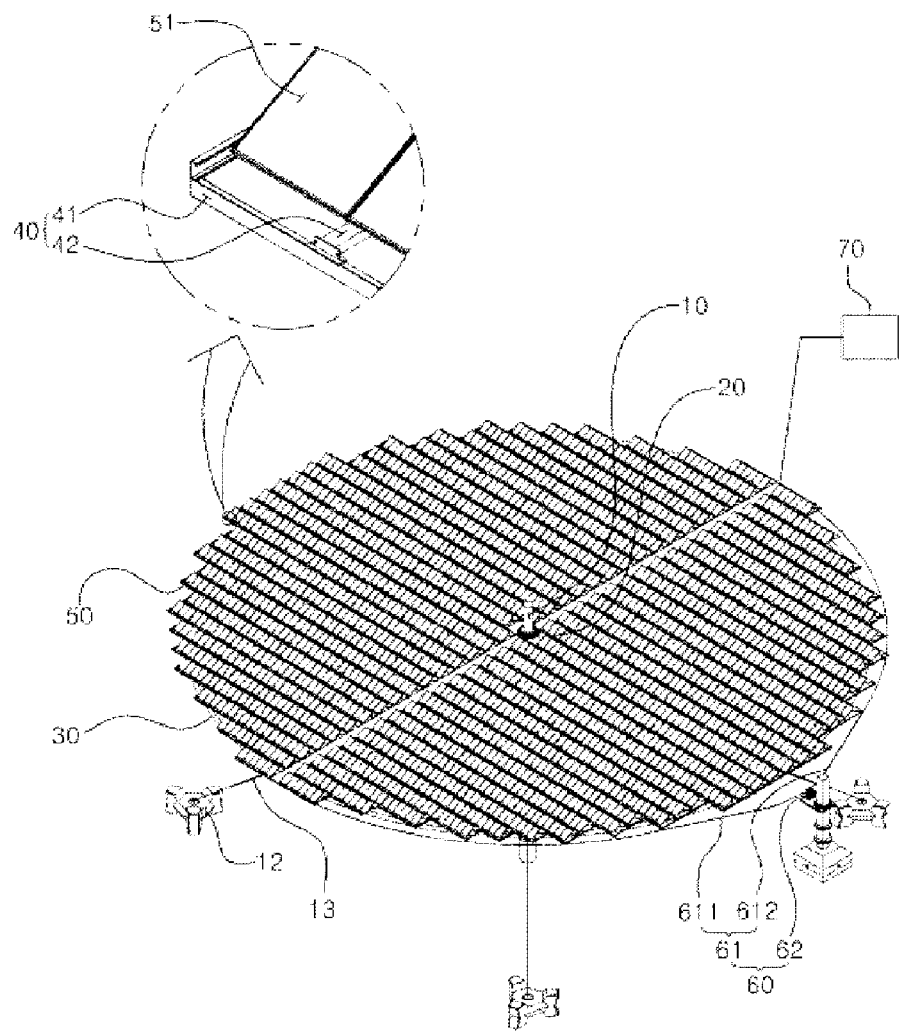
FIG. 3 is a perspective view of a photovoltaic device including a photovoltaic panel with an anti-stain coating film formed according to the method of FIG. 1.

FIG. 3 illustrates a photovoltaic device according to one exemplary embodiment of the present invention. Although the illustrated photovoltaic device is installed on water, the photovoltaic device can also be installed on land.

Referring to FIG. 3, a photovoltaic device of the present invention includes a support frame, and a photovoltaic panel 51 supported by the support frame. The support frame includes an annular floating body 30 that is floatable on water, and a support 40 provided along with the floating body 30. Since the above-described photovoltaic device structure is the same as the structure disclosed in Korean Patent Registration No. 10-1617384, a detailed description thereof will be omitted.

On the surface of the photovoltaic panel 51 used in FIG. 3, an anti-stain coating film shown in FIG. 2 is formed. The anti-stain coating film is formed by the above-described coating method.

That is, the anti-stain coating film is formed by applying a coating liquid after removing contaminants on the surface of the photovoltaic panel. As the coating liquid, the above-described composition prepared by mixing 20 to 60 parts by weight of an acrylic solution, 5 to 15 parts by weight of a fluoroalcohol, and 2 to 10 parts by weight of a metal colloid with respect to 100 parts by weight of an alkoxysilane solution is used.

The photovoltaic panel including the anti-stain coating film as described above has excellent anti-stain properties, so contamination by contaminants such as dust and salt can be maximally inhibited, and accordingly, the power generation efficiency of the photovoltaic panel can be increased.

Figure 4:
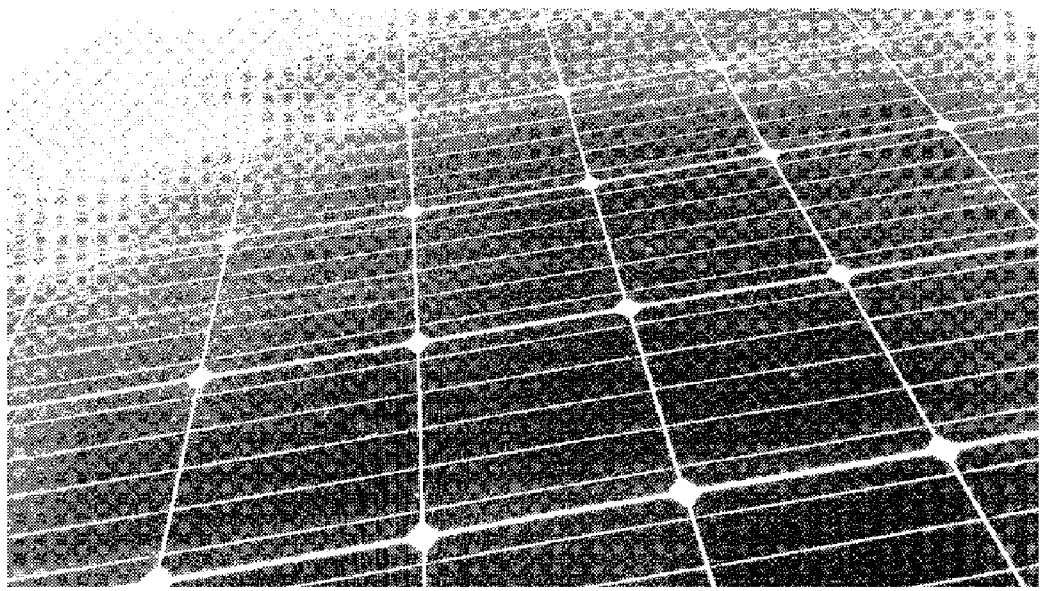
FIG. 4 is a photograph showing the appearance of a photovoltaic panel with an anti-stain coating film formed according to one exemplary embodiment of the present invention.
Figure 5:
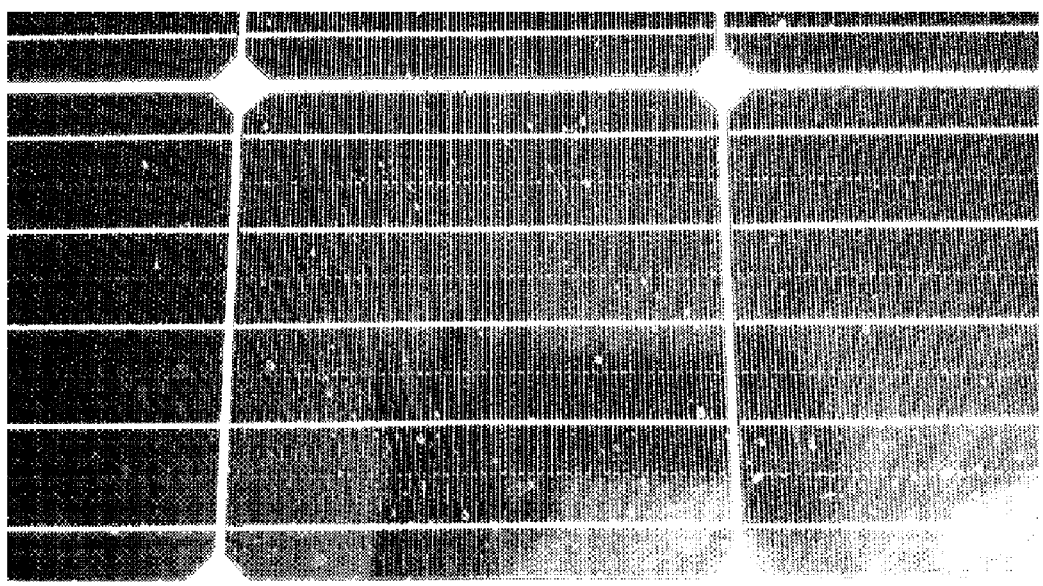
FIG. 5 is a photograph showing the appearance of a photovoltaic panel without an anti-stain coating film.

FIG. 4 illustrates a photovoltaic panel including an anti-stain coating film after six months of use, and FIG. 5 illustrates a photovoltaic panel without an anti-stain coating film after six months of use.

Referring to FIGS. 4 and 5, it can be seen that in the case of the photovoltaic panel including an anti-stain coating film, almost no salt or dust was attached to the surface, whereas in the case of the photovoltaic panel without an anti-stain coating film, salt was attached to several areas of the surface.

Although the present invention has been described above with reference to the exemplary embodiments shown in the drawings, it will be understood by those skilled in the art that the embodiments are merely illustrative and may have various modifications and equivalents. Therefore, the true protection scope of the present invention should be defined only by the appended claims.

The invention claimed is:

1. A method of coating a photovoltaic panel, comprising:
a water-washing step of washing a surface of a photovoltaic panel by spraying water thereon;
a cleaning liquid application step of applying a cleaning liquid on the surface of the photovoltaic panel after the water-washing step;
a rinsing step of removing contaminants and the cleaning liquid on the surface of the photovoltaic panel by spraying washing water after the cleaning liquid application step; and a coating liquid application step of applying a coating liquid on the surface of the photovoltaic panel after the rinsing step and thus forming an anti-stain coating film;
wherein the coating liquid is formed by mixing 20 to 60 parts by weight of an acrylic solution, 5 to 15 parts by weight of a fluoroalcohol, and 2 to 10 parts by weight of a platinum colloid with respect to 100 parts by weight of an alkoxysilane solution; and
wherein the alkoxysilane solution is obtained by mixing, with respect to 100 parts by weight of a solvent, 100 to 150 parts by weight of methyltrimethoxysilane, and the acrylic solution is obtained by mixing 20 to 40 parts by weight of an ethyl acrylate monomer and 2 to 8 parts by weight of polyvinylpyrrolidone with respect to 100 parts by weight of methacrylic acid at a temperature of 70 to 90° C. and then adding 1 to 10 parts by weight of a wax and 0.5 to 5 parts by weight of polyoxyethylene stearyl ether.

2. A method of coating a photovoltaic panel, comprising:
a water-washing step of washing a surface of a photovoltaic panel by spraying water thereon;
a cleaning liquid application step of applying a cleaning liquid on the surface of the photovoltaic panel after the water-washing step;
a rinsing step of removing contaminants and the cleaning liquid on the surface of the photovoltaic panel by spraying washing water after the cleaning liquid application step; and a coating liquid application step of applying a coating liquid on the surface of the photovoltaic panel after the rinsing step and thus forming an anti-stain coating film:
wherein the rinsing step includes:
a) a first spraying step of spraying any one type of washing water selected from among alkaline water, neutral water, and acidic water on the surface of the photovoltaic panel; and
b) a second spraying step of spraying purified water on the surface of the photovoltaic panel after the first spraying step.

3. A method of coating a photovoltaic panel, comprising:
a water-washing step of washing a surface of a photovoltaic panel by spraying water thereon;
a cleaning liquid application step of applying a cleaning liquid on the surface of the photovoltaic panel after the water-washing step;
a rinsing step of removing contaminants and the cleaning liquid on the surface of the photovoltaic panel by spraying washing water after the cleaning liquid application step; and a coating liquid application step of applying a coating liquid on the surface of the photovoltaic panel after the rinsing step and thus forming an anti-stain coating film;
wherein, in the rinsing step, the washing water is sprayed while ultrasonic vibrations are applied to the surface of the photovoltaic panel.

* * * * *